United States Patent
Arai et al.

(10) Patent No.: US 11,404,622 B2
(45) Date of Patent: Aug. 2, 2022

(54) INSULATED HEAT TRANSFER SUBSTRATE, THERMOELECTRIC CONVERSION MODULE, AND METHOD FOR MANUFACTURING INSULATED HEAT TRANSFER SUBSTRATE

(71) Applicant: MITSUBISHI MATERIALS CORPORATION, Tokyo (JP)

(72) Inventors: Koya Arai, Saitama (JP); Shuji Nishimoto, Saitama (JP); Masahito Komasaki, Saitama (JP); Yoshiyuki Nagatomo, Saitama (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/769,311

(22) PCT Filed: Dec. 6, 2018

(86) PCT No.: PCT/JP2018/044892
§ 371 (c)(1),
(2) Date: Jun. 3, 2020

(87) PCT Pub. No.: WO2019/111997
PCT Pub. Date: Jun. 13, 2019

(65) Prior Publication Data
US 2021/0175401 A1    Jun. 10, 2021

(30) Foreign Application Priority Data
Dec. 6, 2017    (JP) .............................. JP2017-234319
Nov. 20, 2018    (JP) .............................. JP2018-217595

(51) Int. Cl.
*H01L 35/30* (2006.01)
*H01L 35/08* (2006.01)
(Continued)

(52) U.S. Cl.
CPC .............. *H01L 35/30* (2013.01); *H01L 35/08* (2013.01); *H01L 35/32* (2013.01); *H01L 35/34* (2013.01)

(58) Field of Classification Search
CPC ......... H01L 35/30; H01L 35/08; H01L 35/32; H01L 35/34
See application file for complete search history.

(56) References Cited

U.S. PATENT DOCUMENTS 6,492,585 B1 * 12/2002 Zamboni ................. H01L 35/32
                                                        136/201
2015/0035137 A1    2/2015 Nishimoto et al.

FOREIGN PATENT DOCUMENTS

DE    10155347 A1 *    6/2003    ............. H05K 1/053
DE    10155347 A1       6/2003
(Continued)

OTHER PUBLICATIONS

International Search Report dated Mar. 5, 2019, issued for PCT/JP2018/044892 and English translation thereof.
(Continued)

*Primary Examiner* — Jayne L Mershon
(74) *Attorney, Agent, or Firm* — Locke Lord LLP; James E. Armstrong, IV; Nicholas J. DiCeglie, Jr.

(57) ABSTRACT

An insulated heat transfer substrate includes a heat transfer layer formed of aluminum or an aluminum alloy, a conductive layer provided on one surface side of the heat transfer layer, and a glass layer formed between the conductive layer and the heat transfer layer, in which the conductive layer is formed of a sintered body of silver, and a thickness of the glass layer is in a range of 5 μm or larger and 50 μm or smaller.

6 Claims, 6 Drawing Sheets

(51) Int. Cl.
*H01L 35/32* (2006.01)
*H01L 35/34* (2006.01)

(56) References Cited

FOREIGN PATENT DOCUMENTS

| | | |
|---|---|---|
| EP | 3352233 A1 | 7/2018 |
| JP | H03-039490 A | 2/1991 |
| JP | 2006-237146 A | 9/2006 |
| JP | 2008-078222 A | 4/2008 |
| JP | 2008-244100 A | 10/2008 |
| JP | 2013-168431 A | 8/2013 |
| JP | 2013168431 * | 8/2013 |
| JP | 2014-011469 A | 1/2014 |
| JP | 2017-059823 A | 3/2017 |
| JP | 2017-157599 A | 9/2017 |

OTHER PUBLICATIONS

Search Report issued in European Patent Application No. EP 18886694.1, dated Aug. 26, 2021.

* cited by examiner

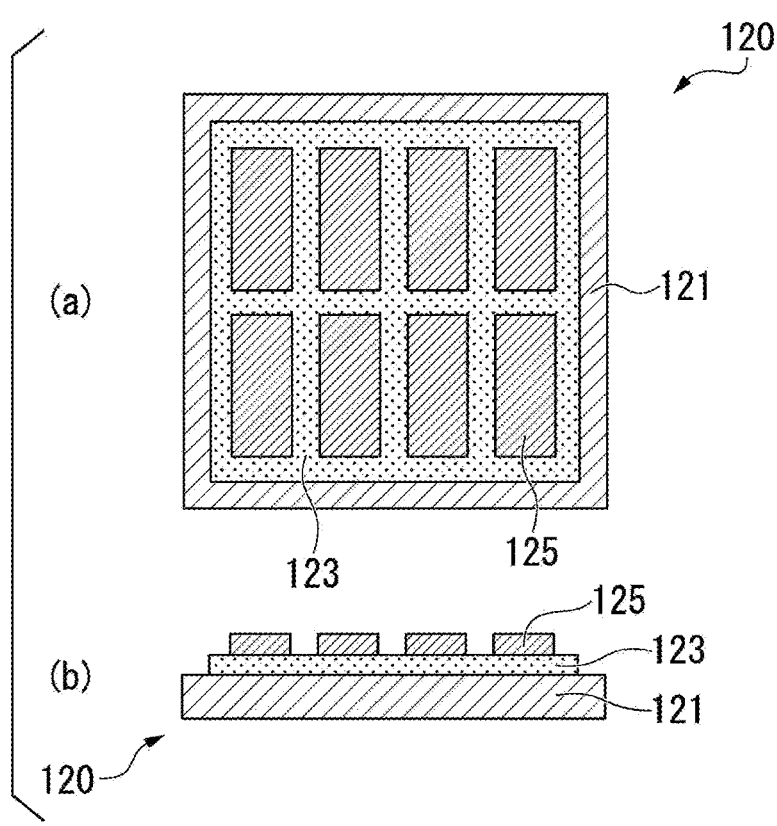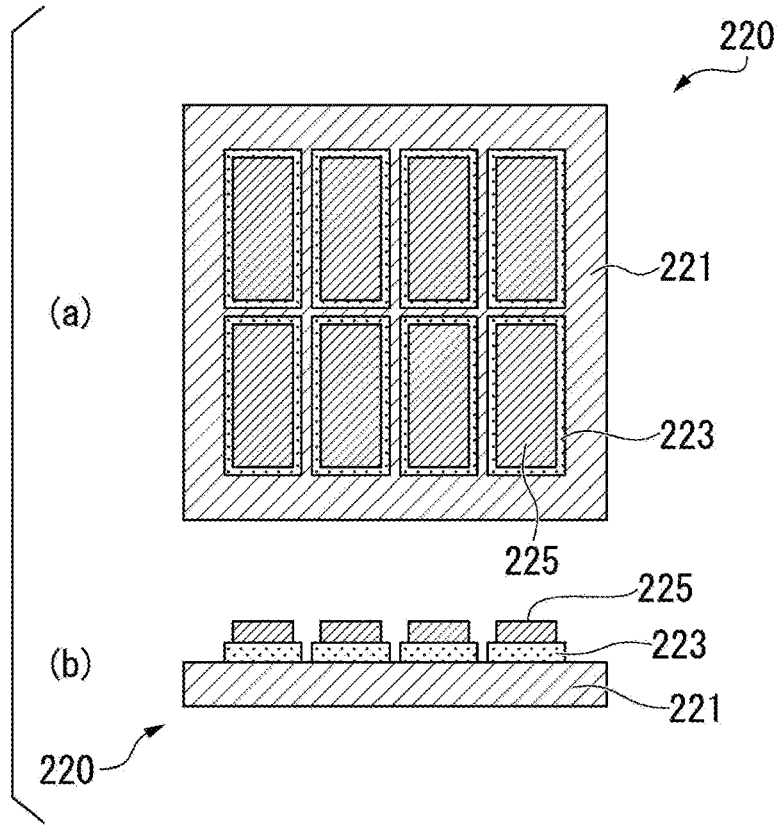

INSULATED HEAT TRANSFER SUBSTRATE, THERMOELECTRIC CONVERSION MODULE, AND METHOD FOR MANUFACTURING INSULATED HEAT TRANSFER SUBSTRATE

TECHNICAL FIELD

The present invention relates to an insulated heat transfer substrate which includes a heat transfer layer and a conductive layer and in which the heat transfer layer and the conductive layer are electrically insulated, a thermoelectric conversion module using the insulated heat transfer substrate, and a method for manufacturing an insulated heat transfer substrate.

Priority is claimed on Japanese Patent Application No. 2017-234319, filed Dec. 6, 2017 and Japanese Patent Application No. 2018-217595, filed Nov. 20, 2018, the contents of which are incorporated herein by reference.

BACKGROUND ART

The thermoelectric conversion module converts heat energy into electric energy or electric energy into heat energy, using a thermoelectric conversion element having a Seebeck effect or a Peltier effect.

As the thermoelectric conversion module described above, for example, a module having a structure in which an n-type thermoelectric conversion element and a p-type thermoelectric conversion element are alternately connected in series was proposed. In such a thermoelectric conversion module, a structure in which heat transfer plates are each disposed on one end side and the other end side of a plurality of thermoelectric conversion elements and the thermoelectric conversion elements are connected to each other in series by conductive layers provided on the heat transfer plates was adopted.

Then, when generating a temperature difference between the heat transfer plate provided at the one end side of the thermoelectric conversion element and the heat transfer plate provided at the other end side of the thermoelectric conversion element, electric energy can be generated by the Seebeck effect.

Alternatively, when applying a current to the thermoelectric conversion element, a temperature difference between the heat transfer plate provided at one end of the thermoelectric conversion element and the heat transfer plate provided at the other end of the thermoelectric conversion element can be generated by the Peltier effect.

Here, as the heat transfer plate described above, for example, as shown in Patent Document 1, an enamel substrate in which an enamel layer is formed on a surface of a metal substrate and an electrode is formed on a side of the enamel layer opposite the metal substrate may be used. The enamel substrate has a structure in which the metal substrate and the electrode are electrically insulated by the enamel layer.

In addition, the enamel substrate described above is also used in, for example, an LED module using an LED element.

CITATION LIST

Patent Document

[Patent Document 1]
Japanese Unexamined Patent Application, First Publication No. H03-039490

SUMMARY OF INVENTION

Technical Problem

Here, in the enamel substrate described above, since a thickness of the enamel layer is formed relatively thick in order to ensure insulation, thermal resistance in a stacking direction increases and there was a concern that heat generated in the element cannot be sufficiently transferred.

In addition, in a case where the enamel layer is thick, there was a concern that an interface may be broken by thermal stress at high temperature due to a difference in thermal expansion between glass used for the enamel layer and a circuit metal formed on the enamel layer.

The present invention was made in view of the circumstances described above, and an object thereof is to provide an insulated heat transfer substrate which has high heat transfer property while having sufficient insulation and can be manufactured relatively easily, a thermoelectric conversion module using the insulated heat transfer substrate, and a method for manufacturing the insulated heat transfer substrate described above.

Solution to Problem

In order to solve the above problems, an insulated heat transfer substrate of the present invention includes a heat transfer layer formed of aluminum or an aluminum alloy, a conductive layer provided on one surface side of the heat transfer layer, and a glass layer formed between the conductive layer and the heat transfer layer, in which the conductive layer is formed of a sintered body of silver, and a thickness of the glass layer is in a range of 5 µm or larger and 50 µm or smaller.

According to the insulated heat transfer substrate of the present invention, since the conductive layer is formed on one surface of the heat transfer layer formed of aluminum or the aluminum alloy via the glass layer having a thickness in the range of 5 µm or larger and 50 µm or smaller, it is possible to ensure insulation between the heat transfer layer and the conductive layer, it is possible to reduce heat resistance in a stacking direction, and excellent heat transfer property is obtained.

In addition, since the conductive layer is formed of the sintered body of silver, a circuit pattern can be formed on the conductive layer by applying a paste containing silver in a pattern and sintering the paste.

Here, in the insulated heat transfer substrate of the present invention, a configuration may be adopted in which the glass layer is formed on the one surface of the heat transfer layer in a pattern.

In this case, since the glass layer is formed on the one surface of the heat transfer layer in a pattern and the conductive layer is formed on the glass layer, the glass layer is not largely exposed on the surface, and is excellent in handleability.

The pattern of the conductive layer may be exactly the same as or smaller than a size of the pattern of the glass layer.

Further, in the insulated heat transfer substrate of the present invention, it is preferable that the thickness of the conductive layer is in the range of 5 µm or larger and 100 µm or smaller.

In this case, since the thickness of the conductive layer is defined as described above, electrical conductivity of the conductive layer can be ensured.

Further, in the insulated heat transfer substrate of the present invention, a configuration may be adopted in which the heat transfer layer is divided into a plurality of blocks and the glass layer and the conductive layer are formed for each of the blocks. In this case, since the heat transfer layer is divided into the plurality of blocks, a joining area between the heat transfer layer and the glass layer which have different thermal expansion coefficients from each other can be formed to be relatively small, and a warpage or the like due to a difference in thermal expansion therebetween can be suppressed. In addition, the insulated heat transfer substrate can be used for a skeleton type or half skeleton type of a thermoelectric conversion module.

In addition, in the insulated heat transfer substrate of the present invention, a configuration may be adopted in which the glass layer and the conductive layer are formed also on the other surface side of the heat transfer layer.

In this case, since the glass layer and the conductive layer are formed on each of one surface side and the other surface side of the heat transfer layer, it is possible to provide thermoelectric conversion elements on both surfaces of the heat transfer layer and a stacked type thermoelectric conversion module can be formed.

A thermoelectric conversion module of the present invention includes a plurality of thermoelectric conversion elements and a first conductive layer and a second conductive layer each provided on one end side and the other end side of the thermoelectric conversion elements, in which the plurality of thermoelectric conversion elements are electrically connected to each other via the first conductive layer and the second conductive layer, and the insulated heat transfer substrate described above is provided on at least one or both of the one end side and the other end side of the thermoelectric conversion elements.

In this case, since the insulated heat transfer substrate is provided on at least one or both of the one end side and the other end side of the thermoelectric conversion elements, excellent thermal conductivity in a stacking direction is obtained and heat of the thermoelectric conversion element can be efficiently transferred to the heat transfer layer. Accordingly, excellent thermoelectric conversion efficiency becomes to be obtained.

In addition, since insulation between the conductive layer and the heat transfer layer is ensured, thermoelectric conversion module has a withstand voltage at a working voltage and can be used stably.

A method for manufacturing the insulated heat transfer substrate described above of the present invention includes a glass layer forming step of applying a glass paste to one surface of an aluminum plate formed of aluminum or an aluminum alloy and sintering the glass paste to form a glass layer; and a conductive layer forming step of applying a glass-containing silver paste onto the glass layer and sintering the glass-containing silver paste to form a conductive layer.

According to the method for manufacturing the insulated heat transfer substrate configured in the manner, since the method includes the glass layer forming step of applying the glass paste and the glass paste to form the glass layer and the conductive layer forming step of applying the glass-containing silver paste onto the glass layer and sintering the glass-containing silver paste to form the conductive layer, the conductive layer and the glass layer can be relatively easily formed on one surface of the heat transfer layer, and the insulated heat transfer substrate can be efficiently manufactured.

In addition, a circuit pattern can be formed on the conductive layer by applying the glass-containing silver paste in a pattern and sintering the glass-containing silver paste. The application of the glass-containing silver paste may be performed a plurality of times to ensure an application thickness.

Here, in the method for manufacturing the insulated heat transfer substrate of the present invention, a configuration may be adopted in which in the conductive layer forming step, after the glass-containing silver paste is applied, a silver paste is further applied, and then sintering is performed.

In this case, the thickness of the sintered body of silver can be ensured, and resistance of the conductive layer can be reduced.

In addition, in the method for manufacturing the insulated heat transfer substrate of the present invention, a configuration may be adopted in which in the glass layer forming step, the glass paste is applied in a pattern.

In this case, the glass layer is formed only on a region where the conductive layer is formed in the one surface of the aluminum plate (heat transfer layer). Therefore, after a plurality of insulated heat transfer substrates are formed using a large aluminum plate, the aluminum plate can be cut in a region where the glass layer is not formed, and the insulated heat transfer substrate can be manufactured more efficiently.

Further, in the method for manufacturing an insulated heat transfer substrate of the present invention, a configuration may be adopted in which the conductive layer is formed on the glass layer obtained by forming the glass layer in the pattern, and then the aluminum plate is divided into a plurality of blocks.

In this case, an insulated heat transfer substrate having a structure in which the heat transfer layer is divided into a plurality of blocks can be efficiently manufactured.

Advantageous Effects of Invention

According to the present invention, it is possible to provide an insulated heat transfer substrate which has high heat transfer property while having sufficient insulation and can be manufactured relatively easily, a thermoelectric conversion module using the insulated heat transfer substrate, and a method for manufacturing the insulated heat transfer substrate described above.

BRIEF DESCRIPTION OF DRAWINGS

FIG. 5 is a schematic explanatory view of an insulated heat transfer substrate according to another embodiment of the present invention. (a) represents a top view and (b) represents a side view.

FIG. 6 is a schematic explanatory view of an insulated heat transfer substrate according to another embodiment of the present invention. (a) represents a top view and (b) represents a side view.

DESCRIPTION OF EMBODIMENTS

Figure 1:
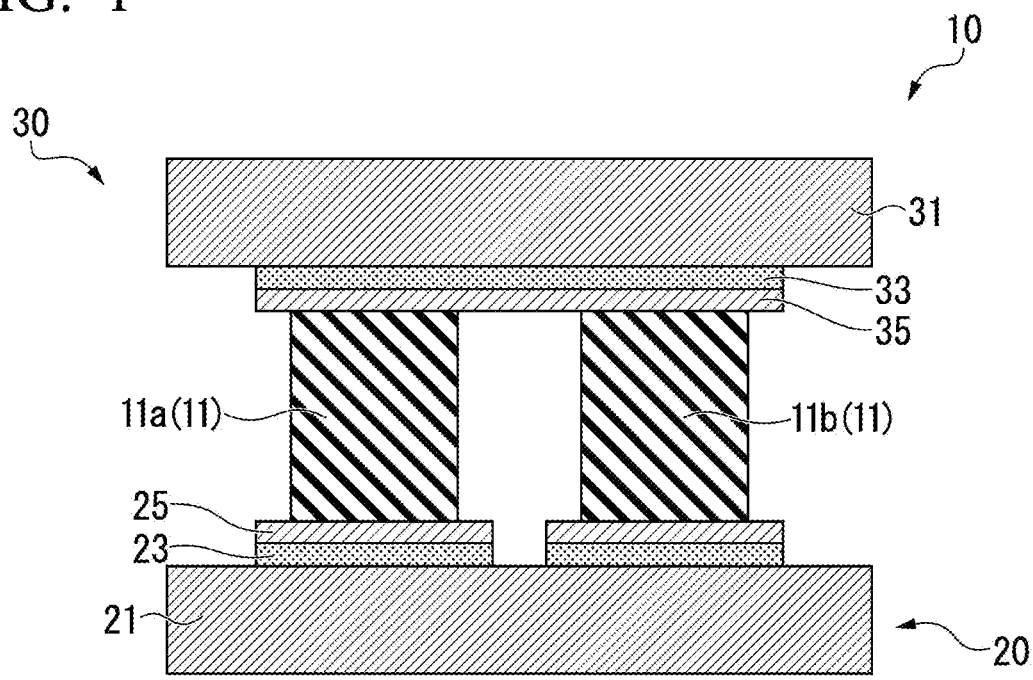
FIG. 1 is a schematic explanatory view of a thermoelectric conversion module including an insulated heat transfer substrate according to an embodiment of the present invention.
Figure 2:
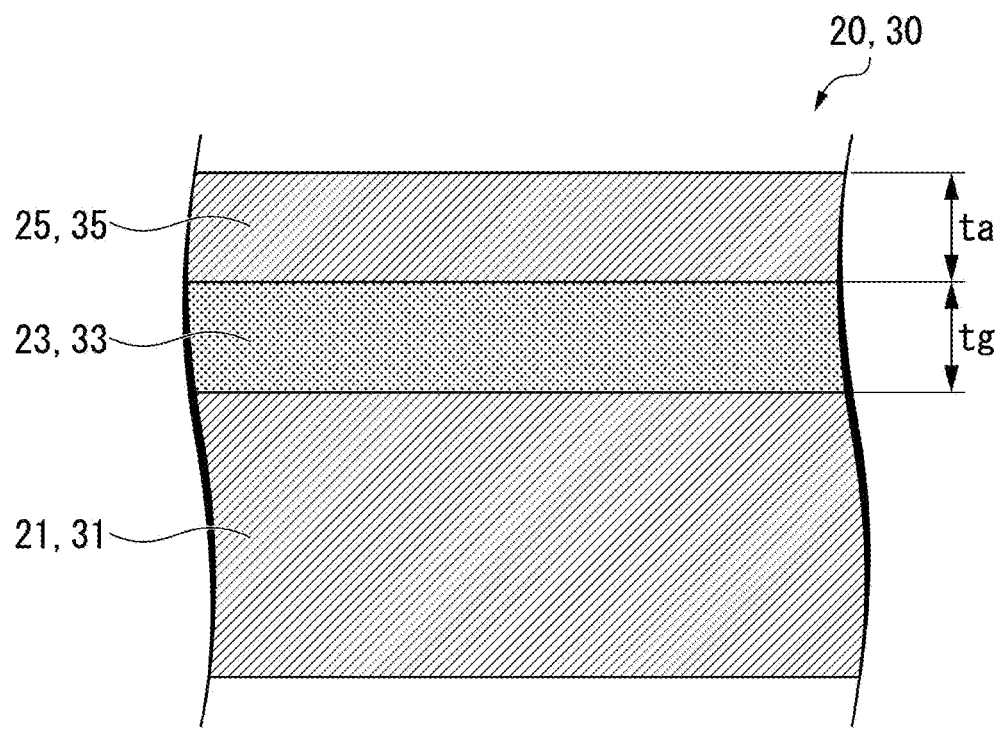
FIG. 2 is a schematic explanatory view of the insulated heat transfer substrate according to the embodiment of the present invention.

Hereinafter, embodiments of the present invention will be described with reference to the accompanying drawings. Each embodiment to be described below is specifically described for better understanding of the gist of the invention and does not limit the present invention unless otherwise specified. In addition, in the drawings used in the following description, for convenience, in order to make the features of the present invention easy to understand, a portion that is a main part may be enlarged in some cases, and a dimensional ratio or the like of each component is not always the same as an actual one.

As shown in FIG. 1, a thermoelectric conversion module 10 according to the present embodiment includes a first insulated heat transfer substrate 20 and a second insulated heat transfer substrate 30 according to the present embodiment, and a plurality of columnar thermoelectric conversion elements 11.

The first insulated heat transfer substrate 20 is provided on one end side (a lower side in FIG. 1) of the plurality of columnar thermoelectric conversion elements 11 in a length direction. The second insulated heat transfer substrate 30 is provided on the other end side of the thermoelectric conversion elements 11 in the length direction. The plurality of columnar thermoelectric conversion elements 11 are electrically connected in series by a first conductive layer 25 provided on the first insulated heat transfer substrate 20 and a second conductive layer 35 provided on the second insulated heat transfer substrate 30.

In the thermoelectric conversion module 10 according to the present embodiment, for example, a first insulated heat transfer substrate 20 side is used as a low temperature portion, and a second insulated heat transfer substrate 30 side is used as a high temperature portion, and conversion between thermal energy and electric energy is performed.

The first insulated heat transfer substrate 20 includes a first heat transfer layer 21 formed of aluminum or an aluminum alloy and the first conductive layer 25 stacked on one surface of the first heat transfer layer 21 via a first glass layer 23.

In the first insulated heat transfer substrate 20 according to the present embodiment, the first glass layer 23 is formed in a pattern, and the first glass layer 23 is not formed on a region where the first conductive layer 25 is not formed in the one surface of the first insulated heat transfer substrate 20.

Here, the first heat transfer layer 21 is formed of an aluminum plate formed of aluminum or an aluminum alloy, and a thickness thereof is, for example, 0.1 mm or larger.

As the aluminum, for example, pure aluminum such as aluminum (2N aluminum) with a purity of 99 mass % or higher, aluminum (3N aluminum) with a purity of 99.9 mass % or higher, and aluminum (4N aluminum) with a purity of 99.99 mass % or higher can be used. As the aluminum alloy, for example, A6061 can be used.

In the present embodiment, as the aluminum plate that forms the first heat transfer layer 21, an A6061 alloy is used.

The first conductive layer 25 is formed of a sintered body of silver and is formed on one surface (an upper surface in FIG. 1) of the first heat transfer layer 21 in a circuit pattern.

Thus, in the present embodiment, the thickness to of the first conductive layer 25 is in a range 5 μm or larger and 100 μm or smaller.

The first glass layer 23 interposed between the first heat transfer layer 21 and the first conductive layer 25 functions as an insulating layer that electrically insulates the first heat transfer layer 21 and the first conductive layer 25 from each other.

Here, in a case where a thickness tg of the first glass layer 23 is smaller than 5 μm, when manufacturing the thermoelectric conversion module 10, there is a concern that, due to pressurization when joining the thermoelectric conversion element 11 or pressurization when using the thermoelectric conversion module 10, the first glass layer 23 may be broken, the first heat transfer layer 21 and the first conductive layer 25 may be short-circuited, and a power generation performance of the thermoelectric conversion module may be reduced. On the other hand, in a case where the thickness tg of the first glass layer 23 is larger than 50 μm, there is a concern that separation may occur at an interface between the first glass layer 23 and the first heat transfer layer 21.

From the above, in the present embodiment, the thickness tg of the first glass layer 23 is defined in the range of 5 μm or larger and 50 μm or smaller.

In order to further suppress breakage of the first glass layer 23 due to pressurization during manufacturing or use of the thermoelectric conversion module 10, a lower limit of the thickness tg of the first glass layer 23 is preferably set to 10 μm or larger. In addition, in order to further suppress the separation at the interface between the first glass layer 23 and the first heat transfer layer 21, an upper limit of the thickness tg of the first glass layer 23 is preferably set to 40 μm or smaller, and further preferably 25 μm or smaller.

The second insulated heat transfer substrate 30 includes a second heat transfer layer 31 formed of aluminum or an aluminum alloy and the second conductive layer 35 stacked on one surface of the second heat transfer layer 31 via a second glass layer 33.

The second insulated heat transfer substrate 30 has the same configuration as that of the first insulated heat transfer substrate 20 described above. A thickness to of the second conductive layer 35 formed of a sintered body of silver is in the range of 5 μm or larger and 100 μm or smaller. A thickness tg of the second glass layer 33 interposed between the second heat transfer layer 31 and the second conductive layer 35 is in the range of 5 μm or larger and 50 μm or smaller. In addition, the second heat transfer layer 31 is formed of an A6061 alloy, and a thickness thereof is 0.1 mm or larger.

In addition, in the second insulated heat transfer substrate 30, the second glass layer 33 is formed in a pattern, and the second glass layer 33 is not formed on a region where the second conductive layer 35 is not formed in the one surface of the second insulated heat transfer substrate 30.

Here, as the glass forming the first glass layer 23 and the second glass layer 33, it is preferable to use lead-free glass containing no lead (Pb).

The lead-free glass is not particularly limited. For example, as the lead-free glass, glass including $Bi_2O_3$, ZnO, and $B_2O_3$ as essential components and including one or more selected from alkali metal oxides such as $SiO_2$, $Al_2O_3$, $Fe_2O_3$, CuO, $CeO_2$, $ZrO_2$, $Li_2O$, $Na_2O$, and $K_2O$ and alkaline earth metal oxides such as MgO, CaO, BaO, and SrO appropriately added thereto as needed can be used.

The thermoelectric conversion element 11 includes an n-type thermoelectric conversion element 11a and a p-type thermoelectric conversion element 11b, and these n-type thermoelectric conversion element 11a and p-type thermoelectric conversion element 11b are alternately arranged.

A metallized layer (not shown) is formed on each of one end surface and the other end surface of the thermoelectric conversion element 11. As the metallized layer, for example, nickel, silver, cobalt, tungsten, or molybdenum, or a nonwoven fabric made of a metal fiber thereof can be used. An outermost surface of the metallized layer (a joining surface between the first conductive layer 25 and the second conductive layer 35) is preferably formed of Au or Ag.

The n-type thermoelectric conversion element 11a and the p-type thermoelectric conversion element 11b are formed of, for example, a sintered body of a tellurium compound, skutterudite, filled skutterudite, Heusler, half-Heusler, a clathrate, silicide, an oxide, or silicon germanium.

As a material of the n-type thermoelectric conversion element 11a, for example, $Bi_2Te_3$, PbTe, $La_3Te_4$, $CoSb_3$, FeVAl, ZrNiSn, $Ba_8Al_{16}Si_{30}$, $Mg_2Si$, $FeSi_2$, $SrTiO_3$, $CaMnO_3$, ZnO, or SiGe is used.

In addition, as a material of the p-type thermoelectric conversion element 11b, for example, $Bi_2Te_3$, $Sb_2Te_3$, PbTe, TAGS (=Ag—Sb—Ge—Te), $Zn_4Sb_3$, $CoSb_3$, $CeFe_4Sb_{12}$, $Ybi_4MnSb_{11}$, FeVAl, $MnSi_{1.73}$, $FeSi_2$, $NaxCoO_2$ $Ca_3Co_4O_7$, $Bi_2Sr_2Co_2O_7$, or SiGe is used.

There are a compound that can take both n-type and p-type by a dopant, and a compound that has only one of n-type and p-type properties.

Figure 3:
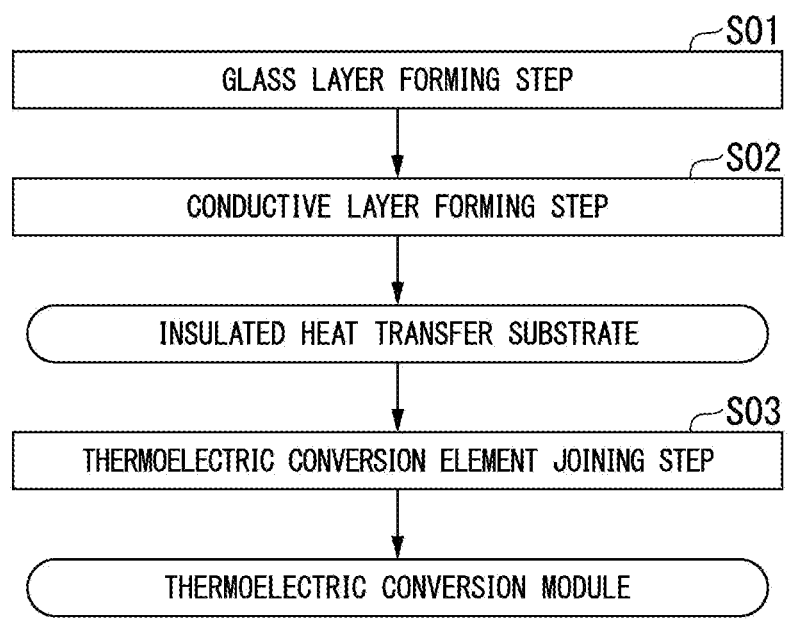
FIG. 3 is a flowchart showing a method for manufacturing the insulated heat transfer substrate and a method for manufacturing the thermoelectric conversion module according to the embodiment of the present invention.
Figure 4:
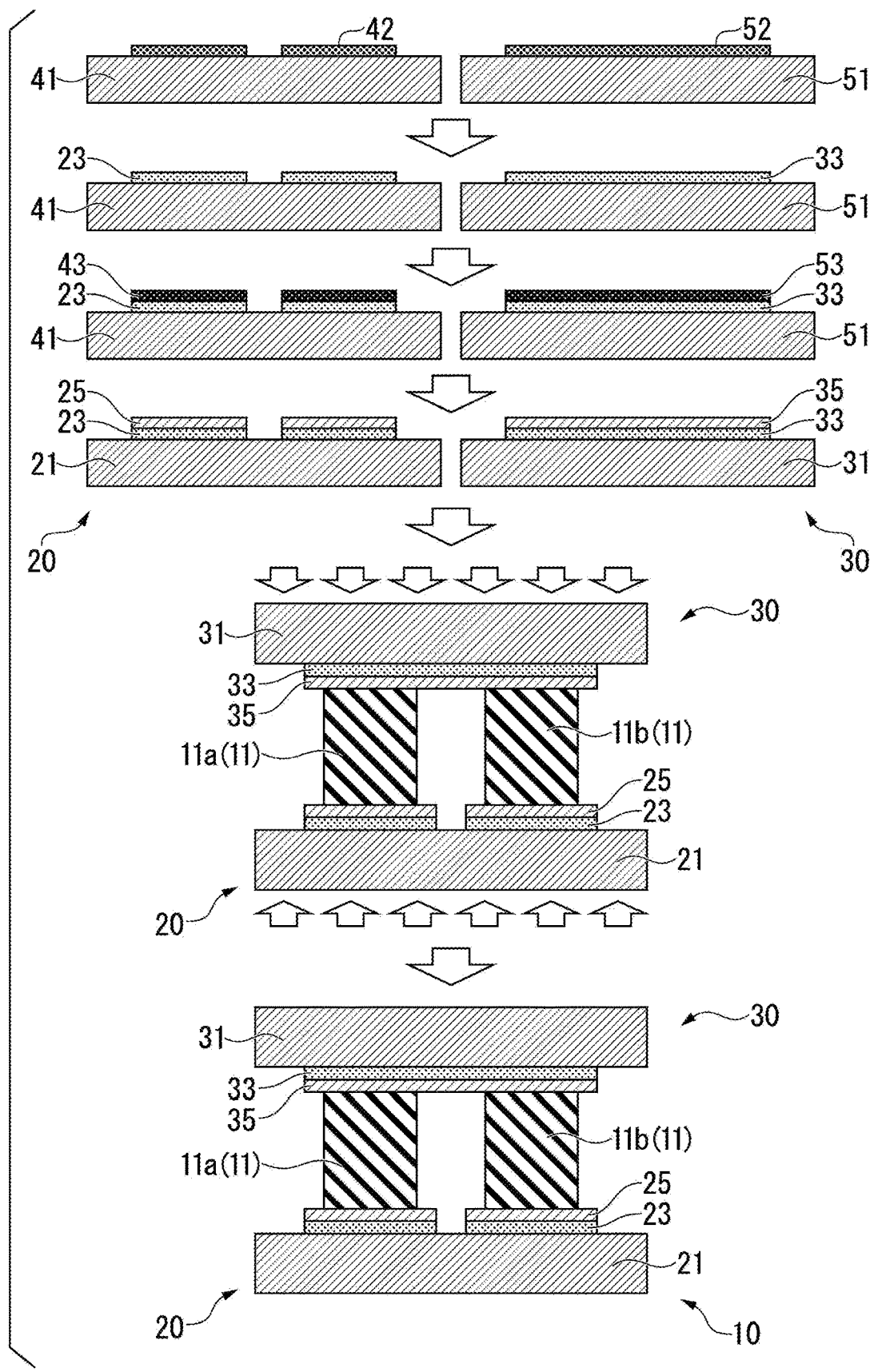
FIG. 4 is a schematic explanatory view showing the method for manufacturing the insulated heat transfer substrate and the method for manufacturing the thermoelectric conversion module according to the embodiment of the present invention.

Then, a method for manufacturing the insulated heat transfer substrate (the first insulated heat transfer substrate 20 and the second insulated heat transfer substrate 30) and the method for manufacturing the thermoelectric conversion module 10 according to the present embodiment described above will be described with reference to FIGS. 3 and 4.

(Glass Layer Forming Step S01)

First, glass pastes 42 and 52 to be described later containing glass powder are applied to one surface of an aluminum plate 41 serving as the first heat transfer layer 21 and one surface of an aluminum plate 51 serving as the second heat transfer layer 31 and are sintered to form the first glass layer 23 and the second glass layer 33. This glass paste does not contain silver.

In the present embodiment, the first glass layer 23 and the second glass layer 33 are formed in a pattern by applying the glass paste in a pattern and sintering the glass paste.

A method for applying the glass paste is not limited, and it is preferable to select an existing method as appropriate.

In addition, for example, the first glass layer 23 and the second glass layer 33 having a desired thickness can be obtained by adjusting the number of times of application of the glass paste.

Further, regarding sintering conditions of the glass pastes 42 and 52, the step is preferably performed under an air atmosphere at a heating temperature of 400° C. or higher and 600° C. or lower with a holding time of 10 minutes or longer and 60 minutes or shorter.

(Conductive Layer Forming Step S02)

Then, glass-containing silver pastes 43 and 53 are applied onto the first glass layer 23 and the second glass layer 33, and as needed a silver paste is applied, dried, and sintered to form the first conductive layer 25 and the second conductive layer 35.

The silver paste contains no glass powder. In addition, the glass-containing silver paste is a paste containing a glass powder and a silver component to be described later. The silver component can be the same as the silver paste.

Here, in the present embodiment, in order to ensure the thickness of the first conductive layer 25 and the second conductive layer 35, the glass-containing silver paste is applied, and the silver paste is further applied thereon.

A method for applying the silver paste or the glass-containing silver paste is not limited, and it is preferably select existing method as appropriate. In addition, glass-containing silver paste and the silver paste may be applied multiple times.

As described above, the thickness of the first conductive layer 25 and the second conductive layer 35 can be set to a desired thickness, by adjusting the number of times of application.

Further, regarding sintering conditions of the silver paste or the glass-containing silver paste, the step is preferably performed under the air atmosphere at the heating temperature of 400° C. or higher and 600° C. or lower with the holding time of 10 minutes or longer and 60 minutes or shorter.

Here, in the present embodiment, glass powder contained in the glass paste and the glass-containing silver paste is a lead-free glass powder as described above, and a specific composition is as follows:

$Bi_2O_3$: 68 mass % or more and 93 mass % or less,
ZnO: 1 mass % or more and 20 mass % or less,
$B_2O_3$: 1 mass % or more and 11 mass % or less,
$SiO_2$: 5 mass % or less,
$Al_2O_3$: 5 mass % or less,
$Fe_2O_3$: 5 mass % or less,
CuO: 5 mass % or less,
$CeO_2$: 5 mass % or less,
$ZrO_2$: 5 mass % or less,
alkali metal oxide: 2 mass % or less, and
alkaline earth metal oxide: 7 mass % or less.

The glass paste in the present embodiment is formed of glass powder and a solvent. In addition, the silver paste is formed of silver powder and a solvent. The glass-containing silver paste is formed of silver powder, glass powder, and a solvent. A resin and a dispersant may be contained as needed. In addition, instead of the silver powder, a silver oxide and a reducing agent may be contained.

As described above, the insulated heat transfer substrate (the first insulated heat transfer substrate 20 and the second insulated heat transfer substrate 30) according to the present embodiment is manufactured.

(Thermoelectric Conversion Element Joining Step S03)

Then, the first conductive layer 25 of the first insulated heat transfer substrate 20 is joined to one end side of the thermoelectric conversion element 11, and the second conductive layer 35 of the second insulated heat transfer substrate 30 is joined to the other end side of the thermoelectric conversion element 11. In the thermoelectric conversion element joining step S03, a method for joining the thermoelectric conversion element 11 to the first conductive layer 25 and the second conductive layer 35 is not particularly limited, and an existing method can be appropriately selected and applied. For example, there is a method of joining a thermoelectric conversion element and a conductive layer to each other using a silver joining material.

According to the above step, the thermoelectric conversion module 10 according to the present embodiment is manufactured.

According to the insulated heat transfer substrate (the first insulated heat transfer substrate 20 and the second insulated heat transfer substrate 30) of the present embodiment with the configuration as described above, the conductive layer ((the first conductive layer 25 and the second conductive layer 35) is formed on one surface of the heat transfer layer (the first heat transfer layer 21 and the second heat transfer layer 31) formed of aluminum or an aluminum alloy, via the glass layer (the first glass layer 23 and the second glass layer 33) having a thickness in a range of 5 µm or larger and 50 µm or smaller. Therefore, it is possible to sufficiently ensure insulation between the heat transfer layer (the first heat transfer layer 21 and the second heat transfer layer 31) and the conductive layer (the first conductive layer 25 and the second conductive layer 35), it is possible to reduce heat resistance in the stacking direction, and excellent heat transfer property is obtained.

Further, in the present embodiment, the glass layer (the first glass layer 23 and the second glass layer 33) is formed in a pattern, and glass layer (the first glass layer 23 and the second glass layer 33) is not formed on a region where the conductive layer ((the first conductive layer 25 and the second conductive layer 35) is not formed in one surface of the heat transfer layer (the first heat transfer layer 21 and the second heat transfer layer 31). Therefore, the glass layer (the first glass layer 23 and the second glass layer 33) is not largely exposed on the surface and is excellent in handleability.

In addition, the conductive layer (the first conductive layer 25 and the second conductive layer 35) is formed of a sintered body of silver, and the thickness to of the conductive layer (the first conductive layer 25 and the second conductive layer 35) is in the range of 5 µm or larger and 100 µm or smaller Therefore, the electrical conductivity of the conductive layer (the first conductive layer 25 and the second conductive layer 35) can be ensured.

According to the thermoelectric conversion module 10 of the present embodiment, the first insulated heat transfer substrate 20 is provided on one end side of the thermoelectric conversion element 11, and the second insulated heat transfer substrate 30 is provided on the other end side of the thermoelectric conversion element 11. Therefore, excellent thermal conductivity in a stacking direction is obtained and heat of the thermoelectric conversion element 11 can be efficiently transferred to the heat transfer layer (the first heat transfer layer 21 and the second heat transfer layer 31). Accordingly, excellent thermoelectric conversion efficiency becomes to be obtained.

In addition, since insulation between the conductive layer (the first conductive layer 25 and the second conductive layer 35) and the heat transfer layer (the first heat transfer layer 21 and the second heat transfer layer 31) is ensured, the thermoelectric conversion module has a withstand voltage at a working voltage and can be used stably.

According to the method for manufacturing the insulated heat transfer substrate (the first insulated heat transfer substrate 20 and the second insulated heat transfer substrate 30) of the present embodiment, the method includes the glass layer forming step S01 of applying the glass paste and sintering the glass paste to form the glass layer (the first glass layer 23 and the second glass layer 33) and the conductive layer forming step S02 of applying the silver paste or the glass-containing silver paste onto the glass layer (the first glass layer 23 and the second glass layer 33) and sintering the glass-containing silver paste to form the conductive layer (the first conductive layer 25 and the second conductive layer 35). Therefore, the conductive layer (the first conductive layer 25 and the second conductive layer 35) and the glass layer (the first glass layer 23 and the second glass layer 33) can be relatively easily formed on one surface of the heat transfer layer (the first heat transfer layer 21 and the second heat transfer layer 31) in a relatively free pattern, and the first insulated heat transfer substrate 20 and the second insulated heat transfer substrate 30 can be efficiently manufactured.

In addition, a circuit pattern can be formed on the conductive layer (the first conductive layer 25 and the second conductive layer 35) by applying the silver paste or the glass-containing silver paste in a pattern and sintering the silver paste or the glass-containing silver paste.

Further, in the present embodiment, in the glass layer forming step SOI, the glass paste is applied in a pattern and sintered to form the glass layer (the first glass layer 23 and the second glass layer 33) in a pattern. Therefore, the glass layer is not formed in a region where the conductive layer is not formed, in one surface of the aluminum plate, and the insulated heat transfer substrate can be manufactured more efficiently by forming a plurality of insulated heat transfer substrates using a large aluminum plate and then cutting the aluminum plate.

In addition, in the present embodiment, since a lead-free glass is used as the glass to be contained in the glass paste and the glass-containing silver paste, the load on an environment can be reduced.

As described above, an embodiment of the present invention are described. However, the present invention is not limited thereto, and can be appropriately modified without departing from the technical idea of the present invention.

For example, in the present embodiment, the insulated heat transfer substrate used for the thermoelectric conversion module was described as an example. However, the present invention is not limited thereto, and the insulated heat transfer substrate of the present invention may be used for an LED module. In addition, the insulated heat transfer substrate of the present invention may be used for a Peltier module.

In addition, in the present embodiment, as the composition of the glass forming the glass layer, the lead-free glass having the composition described above was described as an example. However, the present invention is not limited thereto, and a glass having another composition may be used.

Further, in the present embodiment, as the aluminum or the aluminum alloy forming the heat transfer layer, the A6061 alloy was described as an example. However, the present invention is not limited thereto, and another aluminum or another aluminum alloy may be used.

Further, in the present embodiment, it was described that the glass layer is formed using the glass paste containing the lead-free glass powder having the composition described above. However, the present invention is not limited thereto, and a glass paste containing a glass powder having another composition may be used.

For example, a glass powder containing $SiO_2$, $TiO_2$, and $R_2O$ (R is an alkali metal) as main components and one or more selected from alkaline earth metal oxides, ZnO, $P_2O_5$, and $Sb_2O_3$ as subcomponents may be used. In the glass paste containing the glass powder having the composition, a glass layer to be formed has a relatively large thermal expansion coefficient and is close to the metal forming the conductive layer. Therefore, warpage can be suppressed. In addition, the sintering temperature can be set relatively high, for example, from 600° C. to 650° C., and a dense silver sintered body can be formed.

In addition, in the present embodiment, for example, as shown in FIG. 5, an insulated heat transfer substrate 120 having a structure in which glass layer 123 is formed on one entire surface of a heat transfer layer 121, and a conductive layer 125 is formed on the glass layer 123 in a pattern may be adopted.

Alternatively, for example, as shown in FIG. 6, the insulated heat transfer substrate 220 having a structure in which a glass layer 223 on one surface of a heat transfer layer 221 is formed in a pattern and a conductive layer 225 is formed on the glass layer 223 formed in a pattern may be adopted.

Figure 7:
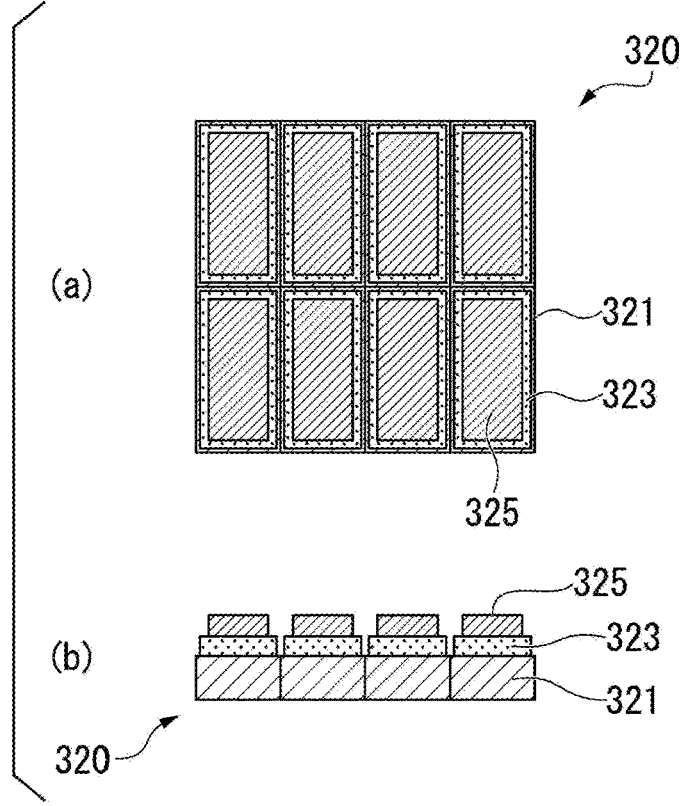
FIG. 7 is a schematic explanatory view of an insulated heat transfer substrate according to still another embodiment of the present invention. (a) represents a top view and (b) represents a side view.

Further, for example, as shown in FIG. 7, an insulated heat transfer substrate 320 having a structure in which a heat transfer layer 321 is divided into a plurality of blocks and a glass layer 323 and a conductive layer 325 are formed for each of the blocks.

Figure 8:
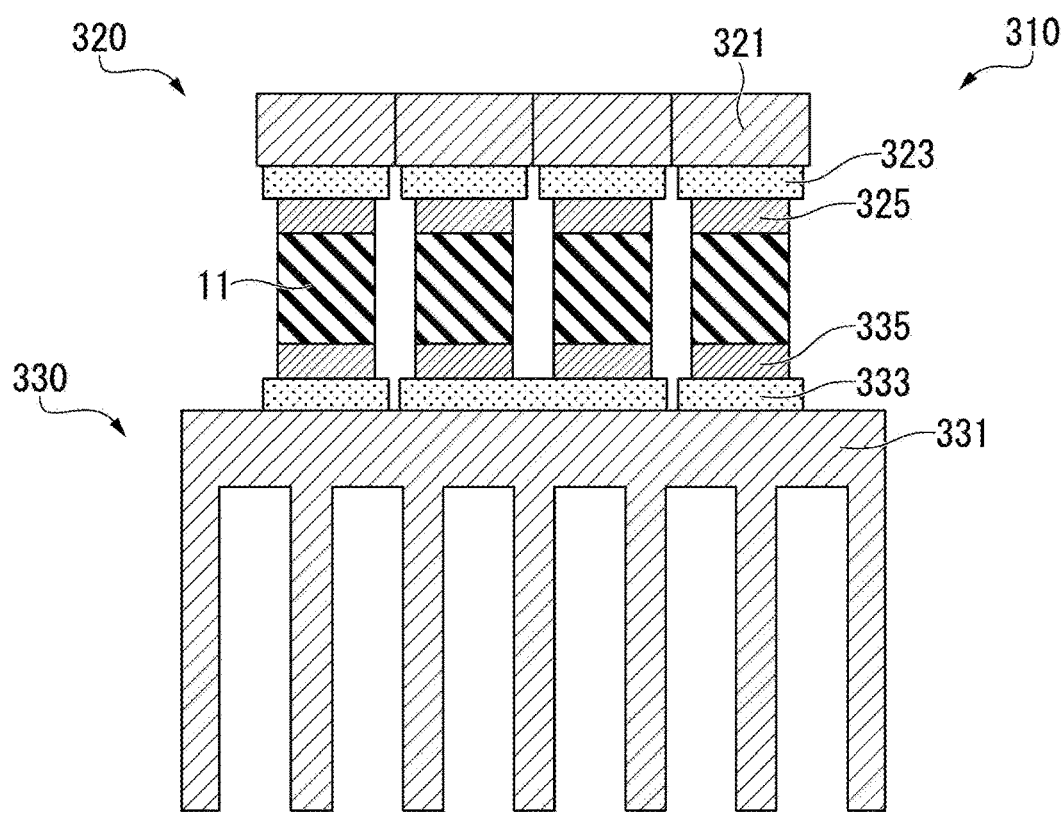
FIG. 8 is a schematic explanatory view of a thermoelectric conversion module using the insulated heat transfer substrate shown in FIG. 7.

In this case, as shown in FIG. 8, an thermoelectric conversion module 310 having a structure in which the insulated heat transfer substrate 320 shown in FIG. 7 is provided on one end side of the thermoelectric conversion element 11 and an insulated circuit substrate 330 having a heat sink (a heat exchanger) as a heat transfer layer 331 on the other end side of the thermoelectric conversion element 11 can be configured. In the thermoelectric conversion module 310 having the configuration, since the one end side of the thermoelectric conversion element 11 is not restricted, it is possible to suppress occurrence of thermal strain.

In the insulated heat transfer substrate 320 shown in FIG. 7, a manufacturing method therefore is not particularly limited. However, the insulated heat transfer substrate 320 can be efficiently manufactured in a manner that a glass layer 323 is formed on one surface of an aluminum plate serving as the heat transfer layer 321 in a pattern, the conductive layer 325 is formed on the glass layer 323, and then the aluminum plate is divided into a plurality of blocks. Here, the aluminum plate may be divided into a plurality of blocks by cutting, or the aluminum plate may be divided into a plurality of blocks by punching.

Figure 9:
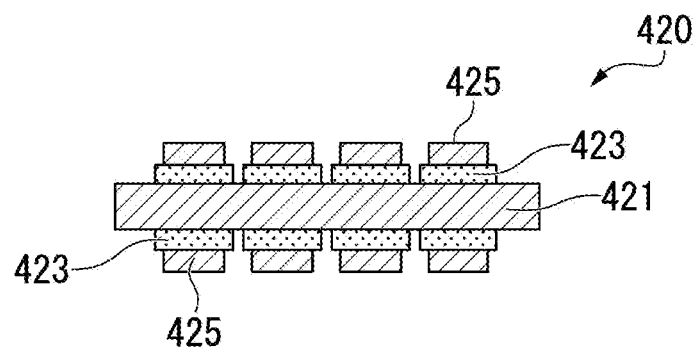
FIG. 9 is a schematic explanatory view of an insulated heat transfer substrate according to still another embodiment of the present invention.

In addition, in the present embodiment, for example, as shown in FIG. 9, an insulated heat transfer substrate 420 having a structure in which a glass layer 423 and a conductive layer 425 are each formed on one surface and the other surface of the heat transfer layer 421 may also be adopted.

Figure 10:
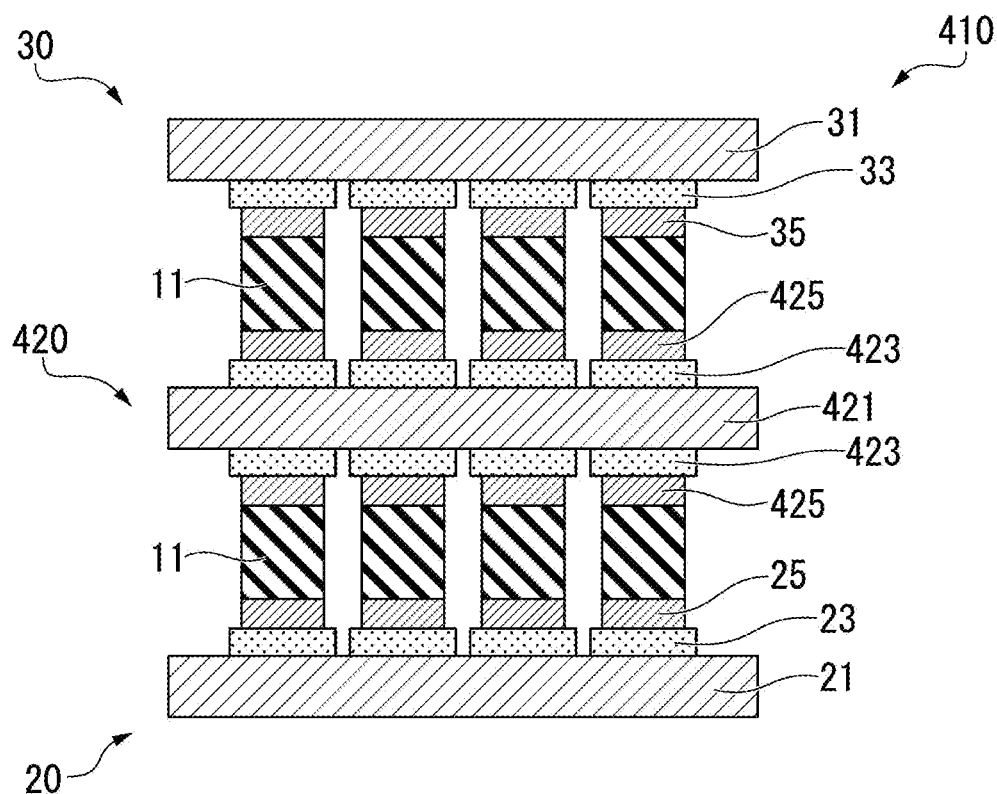
FIG. 10 is a schematic explanatory view of a thermoelectric conversion module using the insulated heat transfer substrate shown in FIG. 9.

In this case, as shown in FIG. 10, a thermoelectric conversion module 410 having a structure in which a plurality of thermoelectric conversion elements 11 are stacked via an insulated heat transfer substrate 420 can be configured.

Examples

A confirmatory experiment performed to confirm effectiveness of the present invention will be described.

An insulated heat transfer substrate having a structure shown in Table 1 was manufactured in the same manner as in the embodiment described above.

A glass paste was applied on a heat transfer layer shown in Table 1 so as to have a thickness shown in Table 1 by adjusting the number of times of application, and then sintered to form a glass layer. After a glass-containing silver paste was applied on the glass layer and dried, a silver paste was applied so as to have a thickness shown in Table 1 by adjusting the number of times of application, and then sintered to form a conductive layer to obtain the insulated heat transfer substrate. In Present Examples 1, 2, 11, and 12, the silver paste was not applied. In Present Examples other than Present Examples 1, 2, 11, and 12 and Comparative Examples, the silver paste was applied plural times. A thickness of the conductive layer and the glass layer, separation between the conductive layer and the glass layer, and insulation between the conductive layer and the heat transfer layer were evaluated for the obtained insulated heat transfer substrate as follows. Table 1 shows evaluation results.

(Thickness of Conductive Layer and Glass Layer)

A thickness of the conductive layer and the glass layer was measured by observing a section of the obtained insulated heat transfer substrate with a laser microscope (VK-X200, manufactured by KEYENCE CORPORATION, magnification: 1000 times) and using a scale attached to the laser microscope. The measurement was performed at a predetermined three places for each layer, and an arithmetic average value was defined as the thickness of the conductive layer and the glass layer.

(Separation Between Conductive Layer and Glass Layer)

The obtained insulated heat transfer substrate was visually observed and evaluated as "B" in a case where separation occurred between the conductive layer and the glass layer, and as "A" in a case where no separation occurred.

(Insulation Between Conductive Layer and Heat Transfer Layer)

Electric resistance between the conductive layer and the heat transfer layer of the obtained insulated heat transfer substrate was measured with a tester (TY720 manufactured by YOKOGAWA Co., Ltd.), and evaluated as "B" in a case where the resistance was less than 500Ω in a continuity check mode of the tester and as "A" in a case where continuity was confirmed.

TABLE 1

|  | Heat transfer layer | | Glass layer | Conductive layer | Separation between conductive layer and glass layer | Insulation between heat transfer layer and conductive layer |
| --- | --- | --- | --- | --- | --- | --- |
|  | Material | Thickness (mm) | Thickness (μm) | Thickness (μm) |  |  |
| Present Example 1 | A1050 | 5 | 5 | 5 | A | A |
| Present Example 2 | A1050 | 5 | 50 | 5 | A | A |
| Present Example 3 | A1050 | 5 | 5 | 50 | A | A |
| Present Example 4 | A1050 | 5 | 10 | 50 | A | A |
| Present Example 5 | A1050 | 5 | 50 | 50 | A | A |
| Present Example 6 | A1050 | 5 | 5 | 100 | A | A |
| Present Example 7 | A1050 | 5 | 10 | 100 | A | A |
| Present Example 8 | A1050 | 5 | 50 | 100 | A | A |
| Present Example 9 | A1050 | 1 | 10 | 50 | A | A |
| Present Example 10 | A1050 | 0.1 | 10 | 50 | A | A |
| Present Example 11 | A6061 | 5 | 5 | 5 | A | A |
| Present Example 12 | A6061 | 5 | 50 | 5 | A | A |
| Present Example 13 | A6061 | 5 | 5 | 50 | A | A |
| Present Example 14 | A6061 | 5 | 10 | 50 | A | A |
| Present Example 15 | A6061 | 5 | 50 | 50 | A | A |
| Present Example 16 | A6061 | 5 | 5 | 100 | A | A |
| Present Example 17 | A6061 | 5 | 10 | 100 | A | A |
| Present Example 18 | A6061 | 5 | 50 | 100 | A | A |
| Present Example 19 | A6061 | 1 | 10 | 50 | A | A |
| Present Example 20 | A6061 | 0.1 | 10 | 50 | A | A |
| Comparative Example 1 | A1050 | 5 | 3 | 50 | A | B |
| Comparative Example 2 | A1050 | 5 | 70 | 50 | B | A |
| Comparative Example 3 | A1050 | 5 | 70 | 100 | B | A |
| Comparative Example 4 | A6061 | 5 | 3 | 50 | A | B |
| Comparative Example 5 | A6061 | 5 | 70 | 50 | B | A |
| Comparative Example 6 | A6061 | 5 | 70 | 100 | B | A |

In Comparative Examples 1 and 4 in which the thickness of the glass layer was 3 μm, the insulation between the conductive layer and the glass layer was poor.

In Comparative Examples 2, 3, 5, and 6 in which the thickness of the glass layer was 70 μm separation occurred between the conductive layer and the glass layer.

On the other hand, in Present Examples 1 to 20 in which the thickness of the glass layer was in the range of 5 μm or larger and 50 μm or smaller, no separation occurred between the conductive layer and the glass layer. In addition, the insulation between the conductive layer and the glass layer was also sufficient.

From the above, it was confirmed that according to Present Examples, it is possible to provide an insulated heat transfer substrate which has high heat transfer property while having sufficient insulation and can be manufactured relatively easily.

REFERENCE SIGNS LIST

10 Thermoelectric conversion module
11 Thermoelectric conversion element
20 First insulated heat transfer substrate (insulated heat transfer substrate)
21 First heat transfer layer (heat transfer layer)
23 First glass layer (glass layer)
25 First conductive layer (conductive layer)
30 Second insulated heat transfer substrate (insulated heat transfer substrate)
31 Second heat transfer layer (heat transfer layer)
33 Second glass layer (glass layer)
35 Second conductive layer (conductive layer)
41, 51 Aluminum plate
120, 220, 320, 420 Insulated heat transfer substrate
121, 221, 321, 421 Heat transfer layer
123, 223, 323, 423 Glass layer
125, 225, 325, 425 Conductive layer
310, 410 Thermoelectric conversion module

The invention claimed is:

1. An insulated heat transfer substrate comprising:
   a heat transfer layer formed of aluminum or an aluminum alloy;
   a conductive layer provided on one surface side of the heat transfer layer; and
   a glass layer formed between the conductive layer and the heat transfer layer,
   wherein
   the conductive layer is formed of a sintered body of silver,
   a thickness of the glass layer is in a range of 5 μm or larger and 50 μm or smaller,
   in a plane view, a size of the conductive layer is smaller than a size of the glass layer, and
   the glass layer is formed on the one surface of the heat transfer layer in a pattern.

2. The insulated heat transfer substrate according to claim 1,
   wherein a thickness of the conductive layer is in a range of 5 μm or larger and 100 μm or smaller.

3. The insulated heat transfer substrate according to claim 1,
   wherein the heat transfer layer is divided into a plurality of blocks, and the glass layer and the conductive layer are formed for each of the blocks.

4. The insulated heat transfer substrate according to claim 1,
   wherein the glass layer and the conductive layer are formed also on the other surface side of the heat transfer layer.

5. The insulated heat transfer substrate according to claim 1,
wherein the conductive layer consists of the sintered body of silver.

6. A thermoelectric conversion module comprising:
a plurality of thermoelectric conversion elements; and
a first conductive layer provided on one end side of the thermoelectric conversion elements; and
a second conductive layer provided on other end side of the thermoelectric conversion elements,
wherein the plurality of thermoelectric conversion elements are electrically connected to each other via the first conductive layer and the second conductive layer, and
the insulated heat transfer substrate according to claim 1 is provided on at least one or both of the one end side and the other end side of the thermoelectric conversion elements.

* * * * *